(12) United States Patent
Asdigha et al.

(10) Patent No.: US 7,119,343 B2
(45) Date of Patent: Oct. 10, 2006

(54) MECHANICAL OSCILLATOR FOR WAFER SCAN WITH SPOT BEAM

(75) Inventors: Mehran Asdigha, Shrewsbury, MA (US); Kurt D. Cleveland, Beverly, MA (US); Jay Krishnasamy, Billerica, MA (US); Kan Ota, Cambridge, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 160 days.

(21) Appl. No.: 10/840,186

(22) Filed: May 6, 2004

(65) Prior Publication Data

US 2005/0247891 A1 Nov. 10, 2005

(51) Int. Cl.
*G21K 5/10* (2006.01)
*G01K 5/08* (2006.01)
*G01F 23/00* (2006.01)

(52) U.S. Cl. ............................ 250/442.11; 250/440.11; 250/441.11

(58) Field of Classification Search ........... 250/440.11, 250/441.11, 442.11
See application file for complete search history.

(56) References Cited

U.S. PATENT DOCUMENTS

| | | | | |
|---|---|---|---|---|
| 5,486,080 A | * | 1/1996 | Sieradzki | 414/217 |
| 5,737,500 A | * | 4/1998 | Seraji et al. | 700/251 |
| 5,741,113 A | | 4/1998 | Bacchi et al. | |
| 5,746,565 A | * | 5/1998 | Tepolt | 414/744.5 |
| 6,384,418 B1 | * | 5/2002 | Fujii et al. | 250/440.11 |
| 6,429,442 B1 | * | 8/2002 | Tomita et al. | 250/492.21 |
| 6,515,288 B1 | | 2/2003 | Ryding et al. | |
| 6,777,687 B1 | * | 8/2004 | Vanderpot et al. | 250/442.11 |
| 6,953,942 B1 | * | 10/2005 | Graf et al. | 250/492.21 |
| 2001/0032937 A1 | | 10/2001 | Berrian | |
| 2003/0068215 A1 | | 4/2003 | Mori et al. | |
| 2003/0192474 A1 | | 10/2003 | Smick et al. | |
| 2005/0184253 A1 | * | 8/2005 | Ioannou et al. | 250/492.21 |

FOREIGN PATENT DOCUMENTS

| | | |
|---|---|---|
| EP | 1 047 101 A2 | 10/2000 |
| EP | 1 056 114 A2 | 11/2000 |
| JP | 11007915 | 1/1999 |
| WO | WO 00/05744 A1 | 2/2000 |

OTHER PUBLICATIONS

International Search Report, Int'l Application No. PCT/US2005/011581, Int'l Filing Date May 4, 2005, 2 pgs.
International Search Report, Int'l Application No. PCT/US2005/011497, Int'l Filing Date May 4, 2005, 2 pgs.

* cited by examiner

*Primary Examiner*—David A. Vanore
(74) *Attorney, Agent, or Firm*—Eschweiler & Associates, LLC

(57) ABSTRACT

The present invention is directed to a scanning apparatus and method for processing a substrate, wherein the scanning apparatus comprises a first link and a second link rigidly coupled to one another at a first joint, wherein the first link and second link are rotatably coupled to a base portion by the first joint, therein defining a first axis. An end effector, whereon the substrate resides, is coupled to the first link. The second link is coupled to a first actuator via at least second joint. The first actuator is operable to translate the second joint with respect to the base portion, therein rotating the first and second links about the first axis and translating the substrate along a first scan path in an oscillatory manner. A controller is further operable to maintain a generally constant translational velocity of the end effector within a predetermined scanning range.

39 Claims, 9 Drawing Sheets

MECHANICAL OSCILLATOR FOR WAFER SCAN WITH SPOT BEAM

FIELD OF THE INVENTION

The present invention relates generally to semiconductor processing systems, and more specifically to an apparatus and method for controlling a quality and precision of motion of a substrate during ion implantation.

BACKGROUND OF THE INVENTION

In the semiconductor industry, various manufacturing processes are typically carried out on a substrate (e.g., a semiconductor wafer) in order to achieve various results thereon. Processes such as ion implantation, for example, can be performed in order to obtain a particular characteristic on or within the substrate, such as limiting a diffusivity of a dielectric layer on the substrate by implanting a specific type of ion. Conventionally, ion implantation processes are performed in either a batch process, wherein multiple substrates are processed concurrently, or a serial process, wherein a single substrate is individually processed. Traditional high-energy or high-current batch ion implanters, for example, are operable to achieve a short ion beam line, wherein a large number of wafers may be placed on a wheel or disk, and the wheel is spun and radially translated through the ion beam, thus exposing all of the substrates surface area to the beam at various times throughout the process. Processing batches of substrates in such a manner, however, generally makes the ion implanter substantially large in size.

In a typical serial process, on the other hand, either an ion beam is scanned in a single axis across a stationary wafer, or the wafer is translated in one direction past a fan-shaped or scanned ion beam. The process of scanning or shaping a uniform ion beam, however, generally requires a complex and/or long beam line, which is generally undesirable at low energies. Furthermore, a uniform translation and/or rotation of either the ion beam or the wafer is generally required in order to provide a uniform ion implantation across the wafer. The relative motion of beam and wafer in translation and/or rotation can be achieved in such manner that the whole surface area of the wafer is implanted with specific ions in a uniform manner. This relative scanning motion can be achieved by mechanical scanning of the wafer through a stationary ion beam, scanning the beam across a relatively stationary wafer, or a combination of scanning both the wafer and the ion beam. In the case of a non-scanned or stationary ion beam, mechanical motion of the wafer should happen in two generally orthogonal axes, wherein the whole wafer surface area is covered by the spot beam by a uniform translation of the wafer along the axes. However, such a uniform translation and/or rotation has been difficult to achieve, due, at least in part, to substantial inertial forces associated with moving the conventional devices and scan mechanisms during processing.

Therefore, a need exists for a device for scanning an ion beam across a substrate, wherein the substrate is uniformly translated and/or rotated with respect to the ion beam.

SUMMARY OF THE INVENTION

The present invention overcomes the limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a scanning apparatus for processing a substrate. According to one exemplary aspect of the invention, a base portion is provided, wherein a first link is rigidly coupled to a second link, and wherein the first and second links are rotatably coupled to the base portion by a first joint. An end effector is coupled to the first link and spaced a predetermined first distance from the first joint, wherein the substrate generally resides on the end effector. A first actuator is generally rigidly coupled to the base portion, wherein the second link is further coupled to the first actuator by at least a second joint. The second joint is spaced a predetermined second distance from the first joint, and the first actuator is consequently operable to translate the second joint with respect to the base portion, thus rotating the first and second links about the first joint, thereby translating the substrate residing on the end effector along a first scan path.

According to another exemplary aspect of the invention the first actuator comprises a curvilinear actuator, wherein the first actuator is operable to translate the second joint along a curvilinear path. The first actuator is operable to translate the second joint in a reciprocating manner, wherein the first link and the second link rotate about the first joint in a reciprocating direction, thus oscillating the end effector along the first scan path.

A second actuator is also provided, wherein the second actuator is further operable to rotate the first and second links about the first joint. The second actuator may comprise a rotary motor, wherein the rotary motor is operable to rotate the first and second links in a clockwise and counterclockwise direction. One or more sensing elements, such as encoders, are operably coupled to one or more of the joints, wherein feedback control of the actuators may be obtained.

In accordance with another exemplary aspect of the invention, a third link may be utilized to couple the first actuator to the second joint. Furthermore, a third actuator may further be utilized to translate the second joint, wherein a fourth link is coupled to the second joint and the third actuator, therein further providing a translational force to the second joint. In accordance with another exemplary aspect of the invention, the first link is substantially longer than the second link, wherein a relatively small translation of the second joint conveys the end effector a relatively large distance along the first scan path.

In accordance with still another exemplary aspect of the invention, a generally constant velocity of the end effector can be maintained in a predetermined range of motion along the first scan path, wherein a translational velocity of the second link with respect to the base portion is controlled, wherein acceleration and deceleration of the end effector occurs outside of the predetermined range of motion of the end effector.

According to yet another exemplary aspect, a secondary translation mechanism is further provided, wherein the base portion and associated oscillatory subsystem are further operable to translate along a second scan path, generally referred to as a slow scan axis, wherein the second scan path is generally perpendicular to at least a portion of the first scan path.

According to another exemplary aspect of the invention, a scanning system is provided, wherein a controller is operable to control the rotational velocity of the first link and second link about the first joint such that the velocity of the substrate within the predetermined range is maintained at a substantially constant value. Also, a method for scanning a substrate is provided, wherein the method comprises rotating the first link and second link in a predetermined manner by translating the second joint with respect to the base portion, wherein the substrate is translated within the predetermined range along the first scan path at a generally constant velocity.

According to another aspect of the invention, a secondary actuation system is coupled to the scanning mechanism, wherein masses coupled to the secondary actuation system are counter-rotated in a synchronous manner in order to cancel reaction forces to the base (e.g., a cancellation of reaction forces which can be caused by the scanning mechanism). The reaction forces, for example, are induced by acceleration and deceleration at the motion turn-around of the reciprocating motion.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
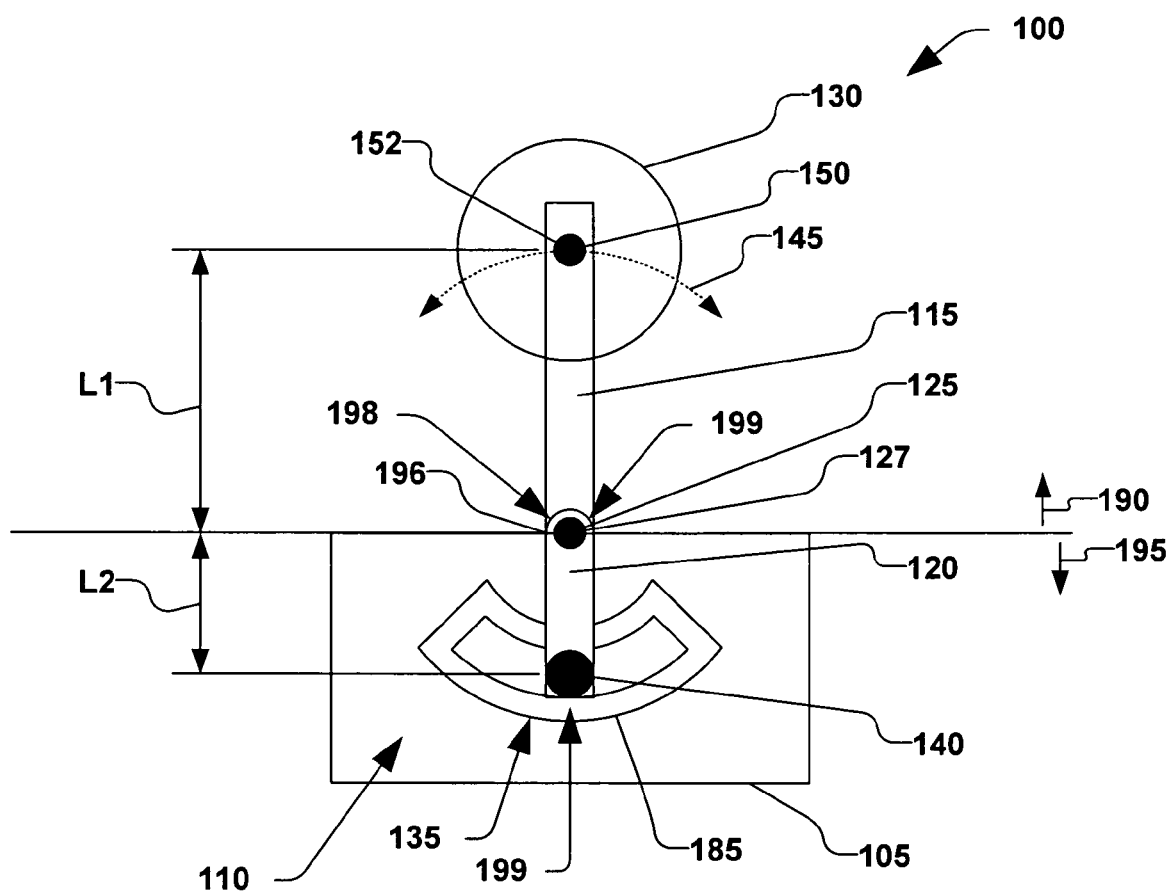
FIG. 1 is a plan view of an exemplary scanning apparatus according to one aspect of the present invention.

The present invention is directed generally towards a scanning apparatus for moving a substrate relative to a beam. More particularly, the scanning apparatus is operable to translate the substrate at a generally constant velocity with respect to a spot beam within a predetermined scan range, wherein a motion of the scanning apparatus oscillates via a cantilevered arm coupled to a translational actuator. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exemplary scanning apparatus 100 according to one exemplary aspect of the present invention. The scanning apparatus 100, for example, may be further associated with an ion beam (not shown) for use in an ion implantation process, as will be discussed hereafter. It should be noted that the present invention may be utilized in conjunction with various semiconductor processing systems, and all such systems are contemplated as falling within the scope of the present invention. The scanning apparatus 100, for example, comprises a base portion 105 operably coupled to an oscillatory subsystem 110. The base portion 105, for example, may be stationary with respect to the beam (not shown), or may be further operable to move with respect to the beam, as will be discussed hereafter. It should be noted that the base portion 105 can be of any shape, and that the rectangular shape utilized in the figures is merely a simplistic illustrative example.

In accordance with one aspect of the invention, the oscillatory subsystem 110 comprises a first link 115 and a second link 120 associated therewith, wherein, for example, the first link and second link are rigidly coupled to one another at a first joint 125. The first joint 125, for example, is further rotatably coupled to the base portion 105, therein defining a rotational first axis 127, about which the first link 115 and second link 120 are operable to rotate. According to one example, the first link 115 and second link 120 are operable to rotate in both a clockwise and counterclockwise direction about the first axis 127. The oscillatory subsystem 110 further comprises an end effector 130 which is operably coupled to the first link 115, wherein the end effector is spaced a predetermined first distance L1 from the first joint 125.

In accordance with another exemplary aspect of the invention, the oscillatory subsystem 110 further comprises a first actuator 135, wherein the first actuator is rigidly coupled to the base portion 105. The second link 120, for example, is operably coupled to a second joint 140, wherein the second joint is further operably coupled to the first actuator 135, and wherein the first actuator is operable to translate the second joint with respect to the base portion 105. The second joint 140, for example, is spaced a predetermined second distance L2 from the first joint 125. In accordance one example, the first distance L1 between the first joint 125 from the end effector 130 is larger than the second distance L2 separating the first joint from the second joint 140, thus providing a mechanical advantage.

Accordingly, upon a translation of the second joint 140 with respect to the base portion 105 via a force input to the first actuator 135, the first link 115 and the second link 120 are consequently operable to rotate about the first axis 127 associated with the first joint 125. Therefore, the oscillatory subsystem 110 of the present invention is operable to translate the end effector 130 with respect to the base portion 105 via the rotation of the first and second links 115 and 120 about the first axis 127, therein generally translating the end effector along a first scan path 145.

The end effector 130, for example, is further operable to secure a substrate (not shown) thereto, wherein a movement of the end effector generally defines a movement of the substrate. In one example, the end effector 130 comprises an electrostatic chuck (ESC), wherein the ESC is operable to substantially clamp or maintain a position of the substrate with respect to the end effector. Alternatively, the end effector 130 may comprise various other devices for maintaining a grip of a payload (e.g., the substrate), and all such devices are contemplated as falling within the scope of the present invention.

The end effector 130, for example, is operably coupled to the first link 115 via a third joint 150 associated with the first link, wherein the third joint is spaced the predetermined first distance L1 from the first joint 125. The third joint 150, for example, is operable to provide a rotation of the end effector 130 about a second axis 152. Furthermore, according to another example, the third joint 150 is further operable to provide a tilt (not shown) of the end effector 130, wherein, in one example, the end effector is operable to tilt about one or more axes (not shown).

In accordance with another exemplary aspect of the invention, the translation of the second joint 140 (and hence, the rotation of the first link 115 and second link 120) can be further controlled in order to oscillate the end effector 130 along the first scan path 145, wherein the substrate (not shown) can be moved in a predetermined manner with respect to the ion beam (e.g., an ion beam which is generally stationary with respect to the base portion 105 and incident with a portion of the scan path). A rotation of the third joint 150, for example, can be further controlled, wherein the end effector 130 is maintained in a generally constant rotational relation with the first scan path 145.

Figure 2:
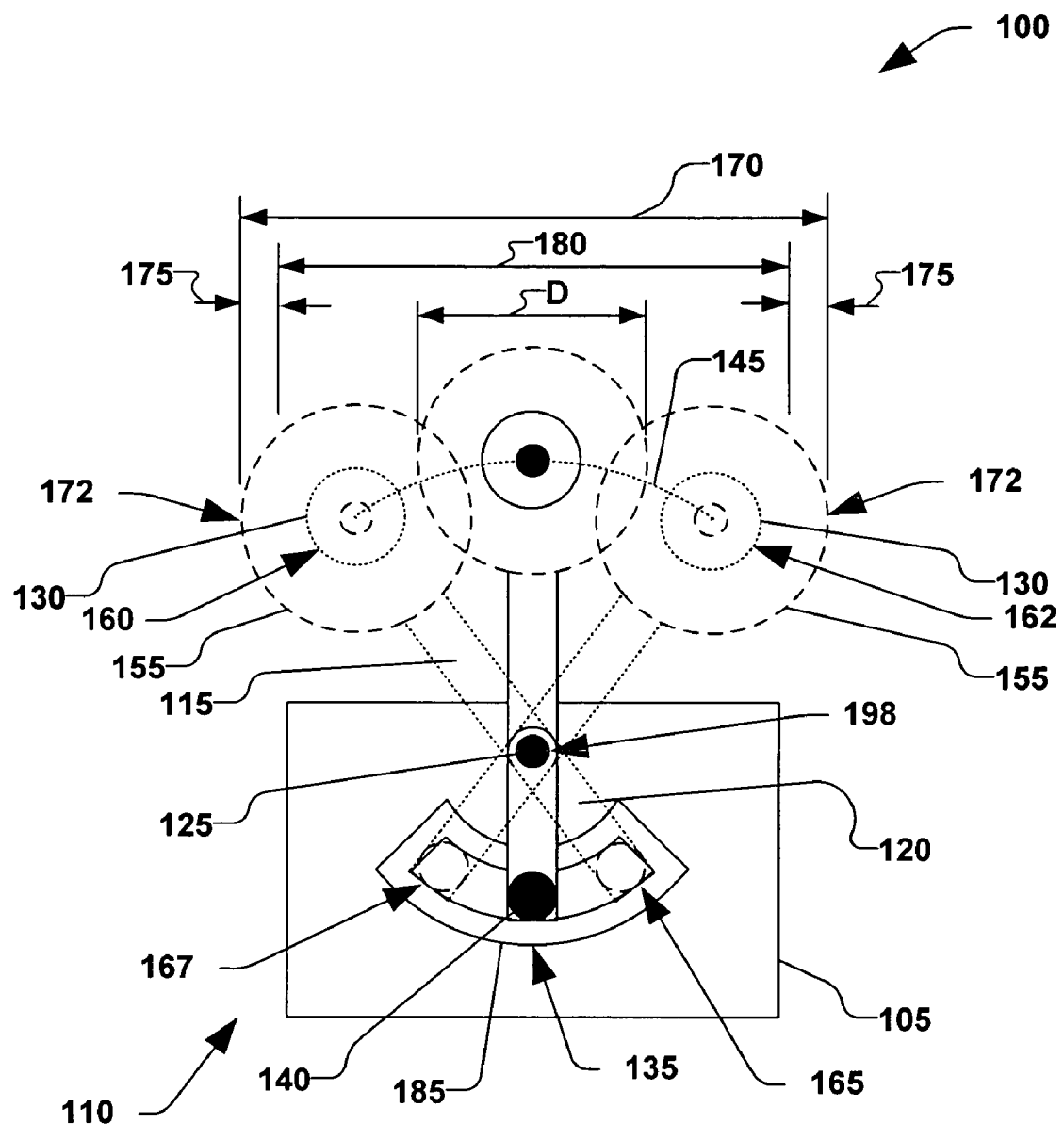
FIG. 2 is a plan view of the exemplary scanning apparatus of FIG. 1 at various positions according to another aspect of the invention.

In order to evenly process the substrate (not shown), it is important to maintain a generally constant translational velocity of the end effector 130 when the substrate is subject to the ion beam while traveling along the first scan path 145. Maintaining a generally constant velocity of the end effector 130 provides a generally uniform scan of the ion beam (not shown) across the substrate residing on the end effector 130, thus evenly processing the substrate as it travels along the arcuate first scan path 145. According to one example, during the oscillation of the end effector 130, a substantially constant velocity of the end effector 130 is generally desirable within a predetermined range of motion thereof. FIG. 2 illustrates the oscillatory subsystem 110 in the various positions, wherein a substrate 155 (illustrated in phantom) further resides on the end effector 130. It should be noted that the rotary subsystem 110 is not drawn to scale, and that the end effector 130 is illustrated as substantially smaller than the substrate 155 for clarity purposes. An exemplary end effector 130 can be approximately the size of the substrate 155, wherein adequate support for the substrate can be provided. It shall be understood, however, that the end effector 130 and other features illustrated can be of various shapes and sizes, and all such shapes and sizes are contemplated as falling within the scope of the present invention.

As illustrated in FIG. 2, the scanning apparatus 100 is operable to oscillate the substrate 155 along the first scan path 145 between maximum positions 160 and 162 of the end effector 130. The maximum positions 160 and 162 of the end effector 130 further correspond to maximum positions 165 and 167 of the second joint 140, relative to the first actuator 135. Therefore, a maximum scan distance 170 traveled by opposite ends 172 of the substrate 155 can be generally defined along the curvilinear first scan path 145 (e.g., opposite ends of the circumference of the substrate along the first scan path), wherein the maximum scan distance is associated with the maximum positions 160 and 162 of the end effector 130 and the maximum positions 165 and 167 of the second joint 140. According to one exemplary aspect of the invention, the maximum scan distance 170 is greater than twice a diameter D of the substrate 155. The amount by which the maximum scan distance 170 is greater than twice the diameter D is defined as an overshoot 175. The overshoot 175, for example, can be advantageously utilized when the oscillation of the substrate 155 along the first scan path 145 changes directions, such as between a clockwise and counter-clockwise rotation of the first link 115 and second link 120.

It should be therefore noted that the substrate 155 oscillates along the first scan path 145, thus changing direction at the maximum positions 160 and 162 (as further associated with maximum positions 165 and 167). Such a change in direction of the end effector 130 (and hence, the substrate 155) is associated with a change in velocity and acceleration of the end effector and substrate. In ion implantation processes, for example, it is generally desirable for the end effector 130 to maintain a substantially constant velocity along a portion of the scan path 145 when the substrate 155 passes through an ion beam (not shown), such as an ion beam which is generally incident with the substrate. Such a constant velocity provides for the substrate 155 to be generally evenly exposed to the ion beam throughout the movement through the ion beam. However, due to the oscillatory motion of the end effector 130, acceleration and deceleration of the end effector is inevitable; such as when the third joint 150 (e.g., associated with the end effector and substrate 155) approaches the maximum positions 160 and 162 at either extent of the curvilinear oscillation. Such an acceleration and deceleration near the maximum positions 160 and 162 and associated maximum positions 165 and 167 of the second joint 140 (e.g., during scan path turn-around), should be maintained at reasonable levels in order to minimize inertial forces and associated reaction forces transmitted to the base portion 105 of the scanning apparatus 100. Furthermore, variations in velocity of the end effector 130 during exposure of the substrate 155 to the ion beam, for example, can lead to a non-uniform ion implantation across the substrate.

Therefore, a generally constant velocity is desired for a predetermined range 180 associated with the movement of the substrate 155 through the ion beam. For example, the predetermined range 180 is associated with the physical dimensions of the substrate 155 (e.g., twice a diameter of the substrate), such that the acceleration and deceleration of the end effector 130 can be generally accommodated within the overshoot 175. Accordingly, once the substrate 155 completely passes through the ion beam, the acceleration and deceleration of the end effector 130 will not substantially affect an ion implantation process or dose uniformity across the substrate. Such a constant velocity, for example, can be obtained by controlling an amount of power applied to the first actuator 135, as will be discussed in more detail infra.

According to another exemplary aspect of the present invention, the first actuator 135 of FIGS. 1 and 2 comprises a curvilinear actuator 185. The curvilinear actuator 185, for example, is operable to curvilinearly translate the second joint 140 with respect to the base portion 105, therein minimizing an amount of moving components associated with the scanning apparatus 100. The curvilinear actuator 185, for example, may comprise one or more rotary motor segments (not shown) having a rotor arc of between approximately 45° and 90° and a stator arc of between approximately 80° and 120°. The curvilinear actuator 185 may further comprise a brushless curvilinear motor (not shown), wherein the curvilinear motor further comprises a ferrous and/or non-ferrous core forcer (not shown). For example, the curvilinear actuator 185 comprises a curvilinear motor having an opposed pair of ferrous core forcers which are sandwiched between a pair of magnetic tracks.

In accordance with another exemplary aspect of the invention, as illustrated in FIG. 1, the scanning apparatus 100 is partitioned between a process chamber environment 190 and an external environment 195, such that a minimum of moving components reside within the process chamber environment. For example, the first joint 125 comprises a dynamically sealed joint 196, wherein the sealed joint substantially seals the process chamber environment 190 (e.g., a vacuum chamber environment under low pressure vacuum) from the external environment 195 (e.g., atmosphere), while still allowing the rotation of the first and second links 115 and 120 about the first axis 127. Such a sealed joint 196, for example, generally isolates the first link 115 and end effector 130, and permits the translation of the end effector 130 within the process chamber environment 190, while limiting potential deleterious effects caused by moving components associated with the first actuator 135. Alternatively, any or all of the scanning apparatus 100 may reside within the process chamber environment 190, wherein the first joint 125 and second joint 140 are substantially sealed to prevent contamination of the process chamber environment.

According to another exemplary aspect of the present invention, the scanning apparatus 100 further comprises a second actuator 198 associated with the first joint 125, wherein the second actuator is further operable to provide a rotational force to the first and second links 115 and 120. For example, the second actuator 198 comprises a servo motor or other rotational device operable to rotate the first link 115 and second link 120 about the first axis 127. The second actuator 198, for example, is fixedly mounted to the base portion 105 of the scanning apparatus 100, and is operable to rotate the first and second links 115 and 120 in both a clockwise and counter-clockwise direction. Such a second actuator 198, for example, can provide additional control by varying the rotational velocity of the first joint during oscillation of the end effector 130. In accordance with one example, the first actuator 135 can be utilized for high acceleration/low accuracy in the overshoot region 175 of FIG. 2, and the second actuator 198 can provide more precise motion control within the predetermined scan range 180.

Furthermore, one or more sensing elements 199 may be associated with one or more of the first joint 125, second joint 140, and third joint 150, wherein an applicable rotational or translational position of the respective joint is sensed for feedback control as will be described infra. For example, the one or more sensing elements 199 may comprise one or more of rotary encoders or linear encoders coupled to the respective first, second, or third joints 125, 140, and 150.

Figure 3:
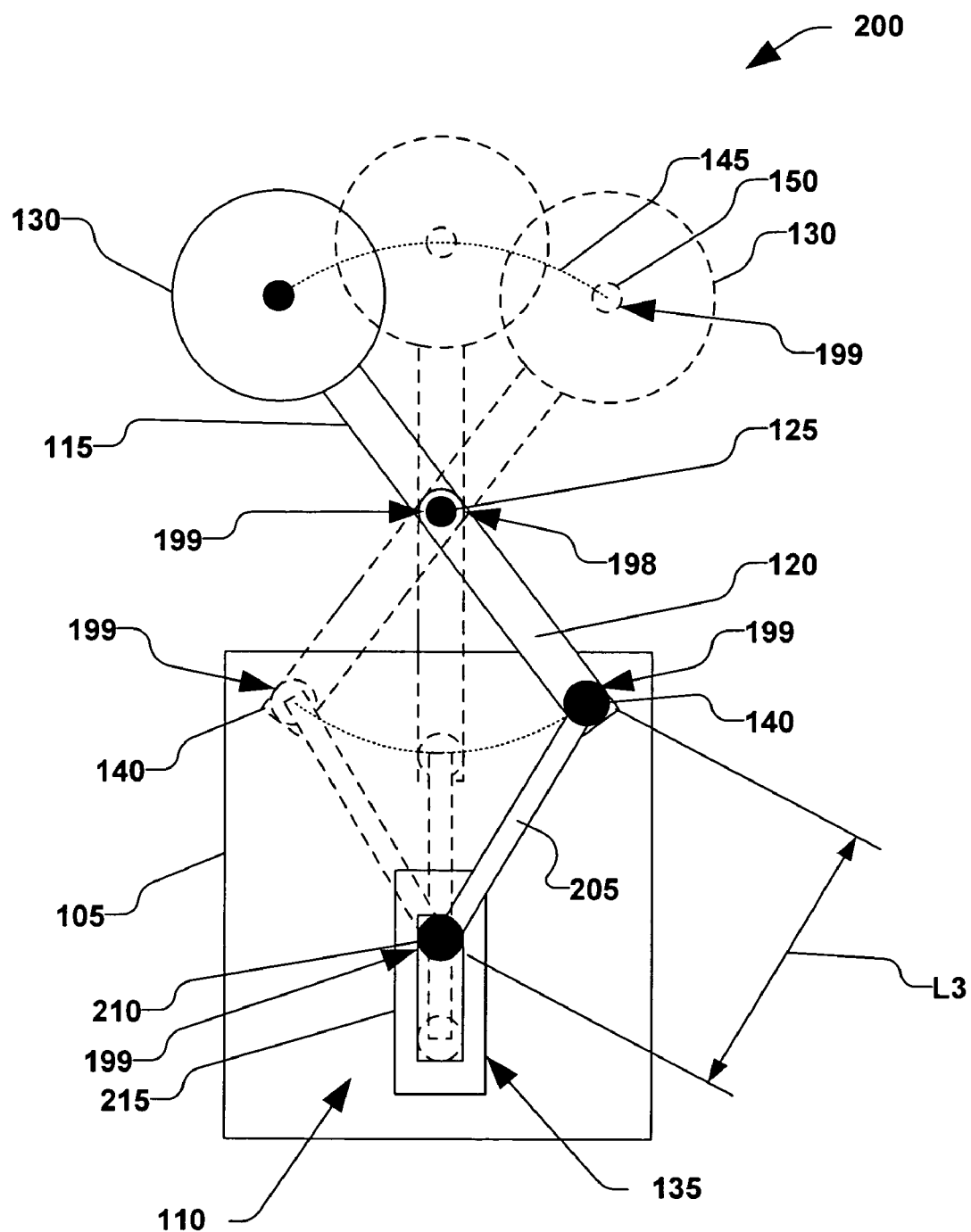
FIG. 3 is a plan view of another scanning apparatus according to another exemplary aspect of the invention.

Referring now to FIG. 3, another exemplary aspect of the invention is illustrated, wherein another exemplary scanning apparatus 200 is shown in various positions. The scanning apparatus 200, for example, comprises a third link 205 rotatably coupled to the second joint 140, wherein the third link is further coupled to the first actuator 135 via a fourth joint 210. The length of the third link 205, for example, is generally defined by the second joint 140 and the fourth joint 210, wherein the second and fourth joints are spaced a predetermined third distance L3 from one another. In this example, the first actuator 135 comprises a linear actuator 215, wherein the linear actuator is operable to linearly translate the fourth joint 210 with respect to the base portion 105, thus translating the second joint 140 in an arcuate manner, and therefore further translating the end effector 130 along the first scan path 145 upon rotation of the first and second links 115 and 120 about the first joint 125. Furthermore, one or more sensing elements 199 may be associated with one or more of the first joint 125, second joint 140, third joint 150, and fourth joint 210, wherein a position of the respective joint is sensed for feedback control as will be described infra.

Figure 4:
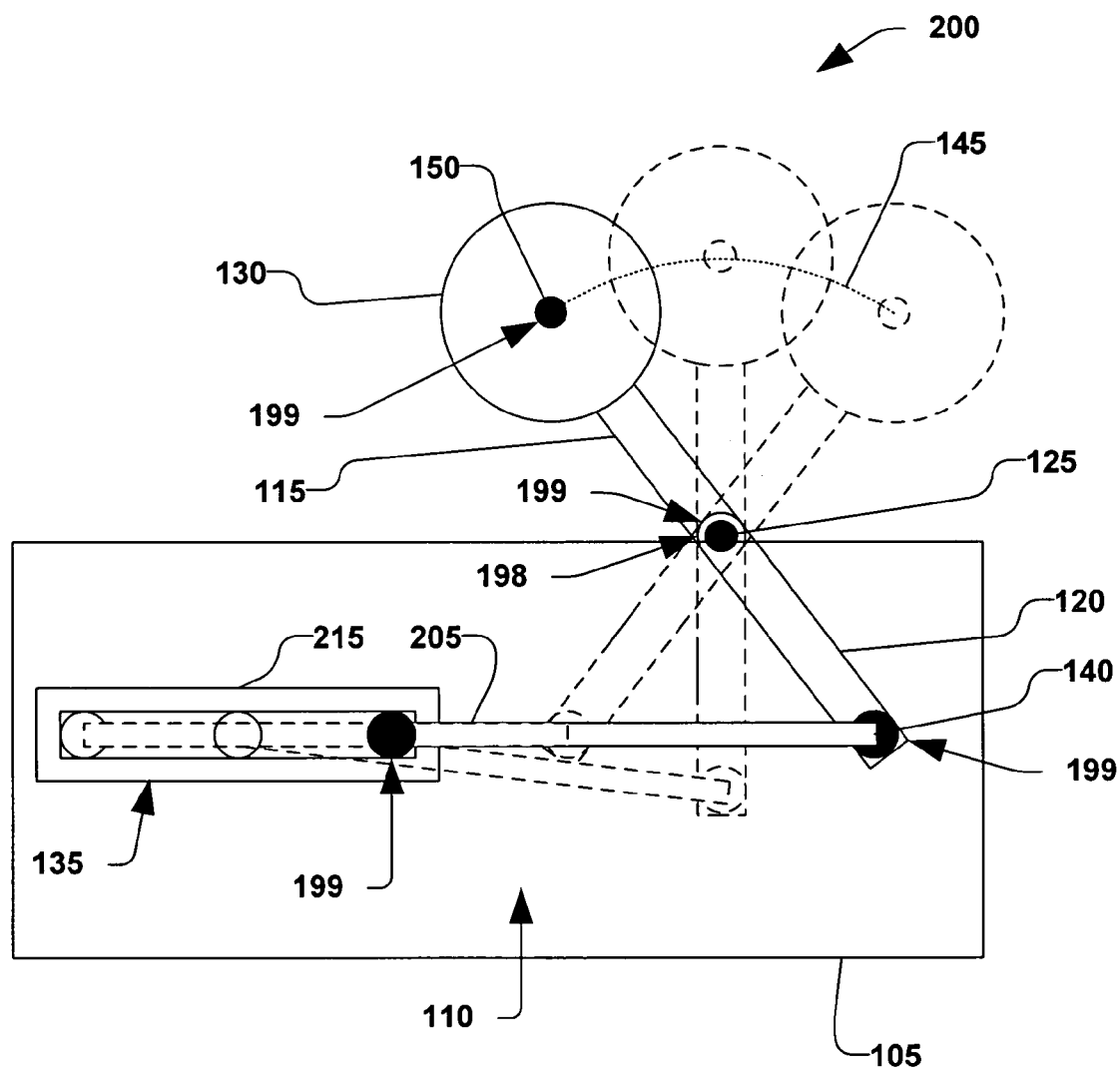
FIG. 4 is a plan view of the scanning apparatus of FIG. 3 illustrating another orientation of a first actuator according to another exemplary aspect of the invention.

The linear actuator 215, for example, can be oriented in a variety of positions with respect to the first joint 125, thus it should be understood that the position and orientation of the linear actuator illustrated in FIG. 3 is not meant to be interpreted in a limiting sense. For example, FIG. 4 illustrates the scanning apparatus 200, wherein the first actuator 135 is oriented approximately 90° offset from the first actuator of FIG. 3. Again, as stated in the aforementioned example, the scanning apparatus 200 may further comprise the second actuator 198 associated with the first joint 125 and rigidly coupled to the base portion 105, wherein the second actuator is operable to provide an auxiliary rotational force to the first and second links 115 and 120.

Figure 5:
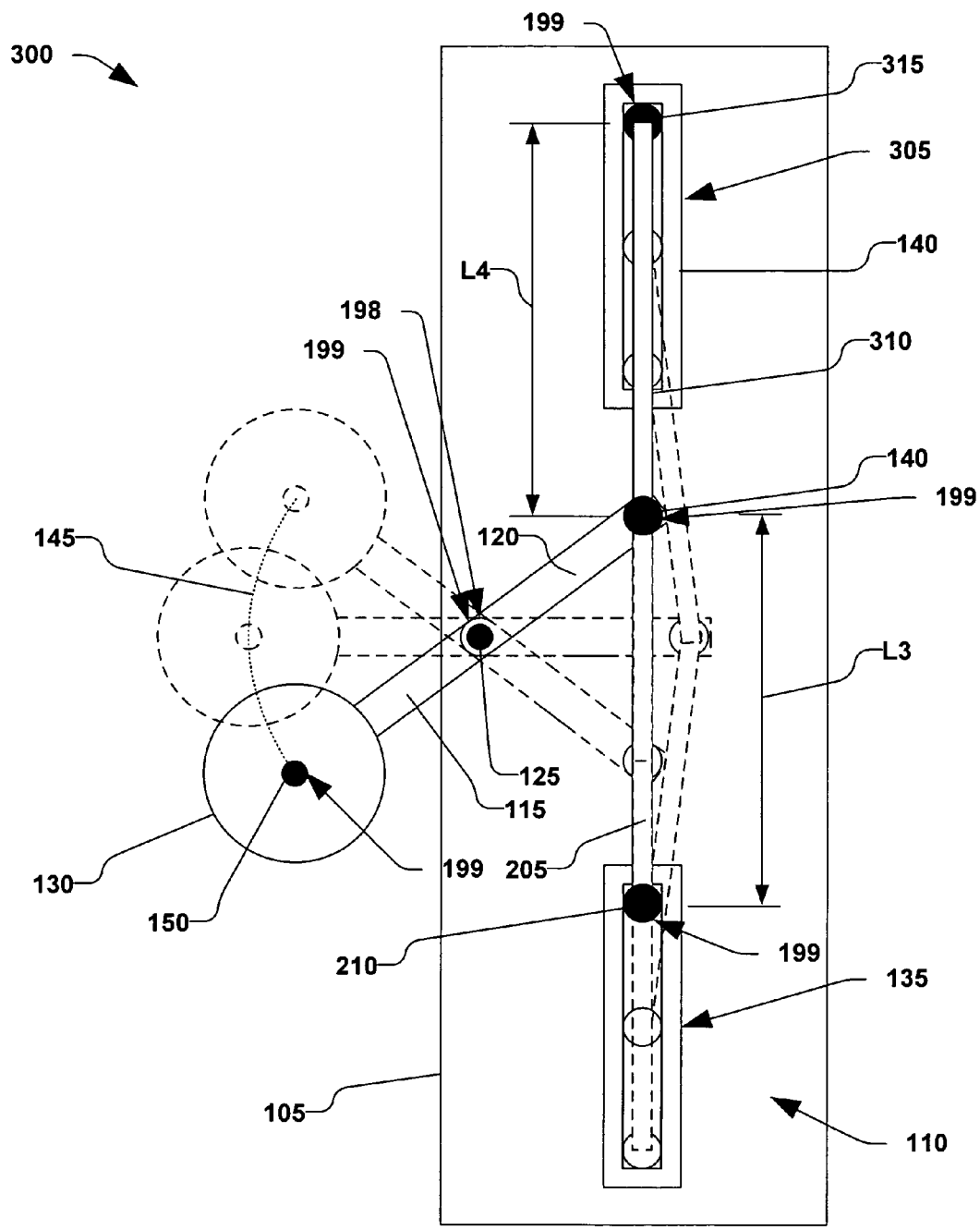
FIG. 5 is a plan view of yet another scanning apparatus according to another exemplary aspect of the present invention.

According to another exemplary aspect of the present invention, FIG. 5 illustrates another exemplary scanning apparatus 300, wherein the scanning apparatus further comprises a third actuator 305 rigidly coupled to the base portion 105. The third actuator 305 is further coupled to a fourth link 310 via a fifth joint 315. The fourth link 310 is further rotatably coupled to the second joint 140 via a fourth link 310, wherein a length of the fourth link is generally defined by a fourth distance L4 between the second joint 140 and the fifth joint 315. The fourth distance L4, for example, is approximately equal to the third distance L3.

The third actuator 305, therefore, is operable to translate the fifth joint 315 with respect to the base portion 105, therein further driving the translation of the second joint 140 as described above. The addition of such a third actuator 305, for example, can provide numerous advantages, such as dividing the force required to translate the second joint 140 between the first and third actuators 135 and 305, thus permitting a greater design window for actuator selection. Again, one or more sensing elements 199 may be associated with one or more of the first joint 125, second joint 140, third joint 150, fourth joint 210, and fifth joint 315, wherein a position of the respective joint is sensed for feedback control.

Figure 6:
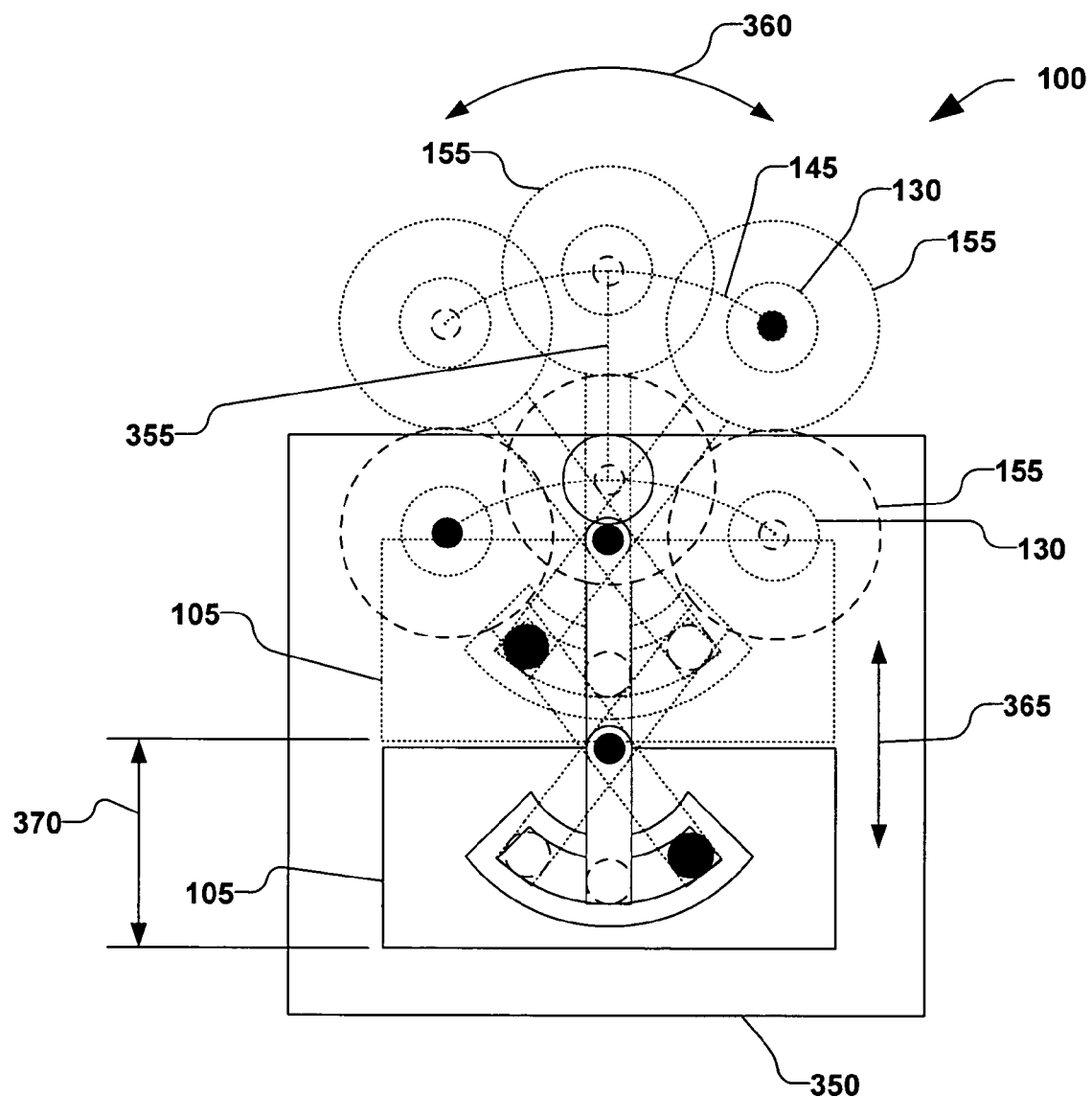
FIG. 6 is a plan view of a secondary translation of an exemplary scanning apparatus according to another aspect of the invention.

FIG. 6 illustrates another exemplary aspect of the present invention, wherein the base portion 105 of the exemplary scanning apparatus 100 is further operable to translate in one or more directions. For example, the base portion 105 is operably coupled to a secondary translation mechanism 350, wherein the secondary translation mechanism is operable to translate the base portion and oscillatory subsystem along a second scan path 355. In one example, the second scan path 355 is substantially perpendicular to at least a portion of the first scan path 145. For example, the second scan path 355 is substantially perpendicular to midpoint of the first scan path 145. According to another exemplary aspect of the invention, the first scan path 145 is associated with a fast scan 360 of the substrate 155, and the second scan path 355 is associated a slow scan 365 of the substrate, wherein the substrate is indexed one increment along the second scan path for every translation of the substrate between maximum positions 160 and 162 along the first scan path (e.g., as illustrated in FIG. 2). Therefore, for a full oscillation of the substrate 155 along the first scan path 145 the secondary translation mechanism 350 will translate the substrate two increments along the second scan path 355. A total translation 370 of the base portion 105, for example, is approximately the diameter D of the substrate 155. According to another example, the total translation 370 of the base portion 105 is approximately equal to the diameter D of the substrate 155 plus an additional distance which is utilized for reversal of direction (e.g., wafer turn-around) along the second scan path 355. For example, during wafer turn-around, the ion beam (not shown) is generally located beyond the diameter D of the substrate 155.

The secondary translation mechanism 350 of FIG. 6, for example, may further comprise a prismatic joint (not shown). The secondary translation mechanism 350 may still further comprise a ball screw system (not shown), wherein the base portion 105 can be smoothly translated along the second scan path 355. Such a secondary translation mechanism 350, for example, is operable to "paint" the substrate 155 residing on the end effector 130 by passing the substrate through the ion beam in an incremental manner during the oscillation of the end effector, thus uniformly implanting ions across the entire substrate.

Figure 7A:
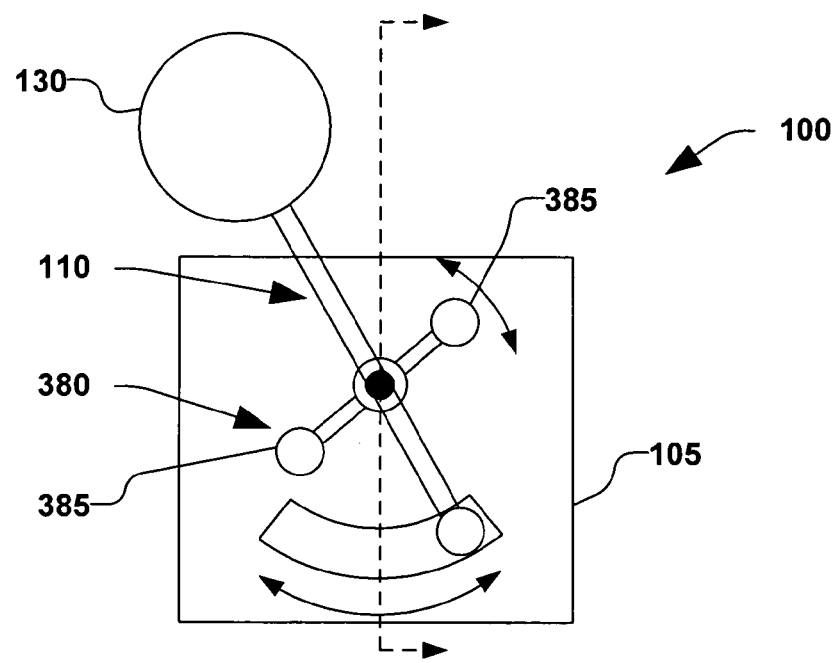
FIG. 7A is a plan view of a secondary actuation system in conjunction with the scanning apparatus according to still another exemplary aspect of the present invention.
Figure 7B:
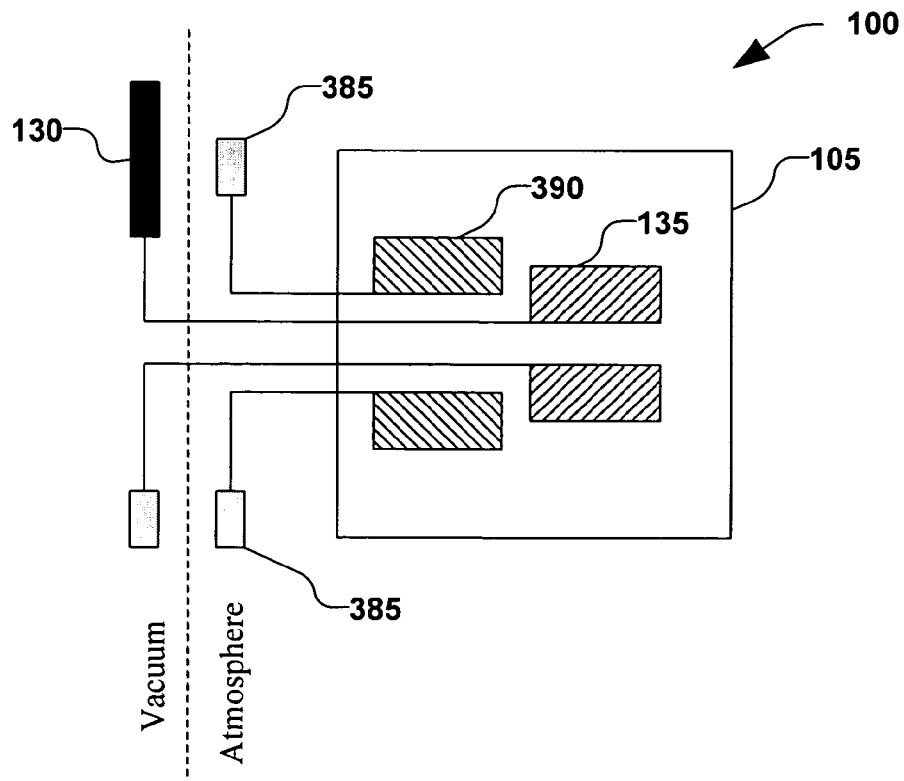
FIG. 7B is a partial cross-sectional view of the scanning apparatus of FIG. 7A according to another exemplary aspect of the invention.

According to another exemplary aspect of the invention, as illustrated in FIGS. 7A and 7B, the scanning apparatus 100 further comprises a secondary actuation system 380 operable to counter-act inertial forces induced by the oscillation of the end effector 130. The secondary scanning mechanism 380, for example, comprises one or more masses 385 rotatably coupled to the oscillatory subsystem 110, wherein the one or more masses are operable to be counter-rotated in a synchronous manner. The rotation of the one or more masses 385, for example, generally cancels reaction forces (e.g., a cause of vibration) seen by the base portion 105, wherein the reaction forces are generally induced by the acceleration and deceleration of the end effector 130 at the reversal of the reciprocating motion of the end effector. Accordingly, the secondary actuation system 380, for example, is operable to counteract the torque seen at the base during reversal of direction of the end effector 130 by producing an approximately equal amount of torque in a direction generally opposite to forces created by the end effector.

According to one example, as illustrated in FIG. 7B, the secondary actuation system 380 is isolated from the oscillatory subsystem 110, such that an environment in which the secondary actuation system operates is isolated from an environment in which the end effector 130 oscillates (e.g., the end effector generally oscillates in a vacuum, while the one or more masses 385 rotate in a generally atmospheric environment).

According to another example, the one or more masses 385 are rotated by a counterbalance actuator 390. The counterbalance actuator 390, for example, is further synchronized with the first actuator 135, such that inertia from the oscillating end effector 130 is generally counter-acted by the one or more masses 385 in order to achieve reaction-force cancellation at the base portion 105. Alternatively, other counter-balancing mechanisms can be used in order to achieve reaction force cancellation, and all such mechanisms are contemplated as falling within the scope of the present invention. For example, magnetic force can be utilized to move counter-acting masses.

Figure 8:
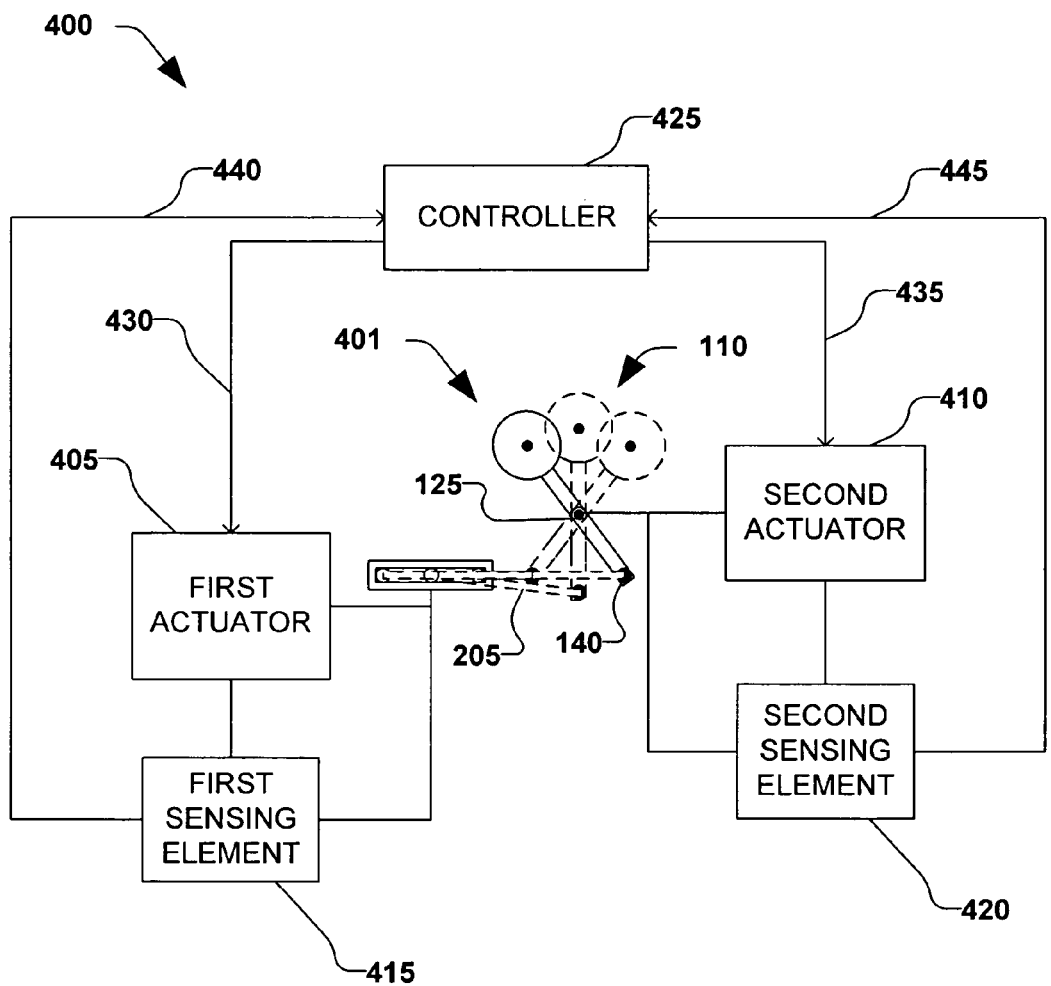
FIG. 8 is a system-level block diagram of an exemplary scanning system according to yet another aspect of the present invention.

FIG. 8 illustrates another exemplary aspect of the present invention in block diagram form, wherein a scanning system 400 is disclosed. The scanning system 400, for example, comprises a scanning apparatus 401, such as the scanning apparatus 200 of FIG. 4. It should be understood that the scanning system 400 may comprise various alternative scanning apparatus 401, such as scanning apparatus 100 or 300 illustrated in FIGS. 1 and 5, and incorporation of all such scanning apparatus are contemplated as falling within the scope of the present invention.

Referring again to the exemplary scanning system of FIG. 8, a first actuator 405 is associated with the second joint 140 (e.g., via the third link 205), and a second actuator 410 is associated with the first joint 125, wherein the first actuator and second actuator are operable to provide a respective linear force and rotational force to the respective second and first joints as described above. It should be noted that, for the scanning apparatus 100 of FIGS. 1 and 2, the first actuator comprises the curvilinear actuator 185. The scanning system 400 of FIG. 8, for example, further comprises a first sensing element 415 and a second sensing element 420 associated with the respective first and second actuators 405 and 410, wherein the first and second sensing elements are further operable to sense position, or other kinematic parameters, such as velocity or acceleration, of the respective second and first joints 140 and 125.

Furthermore, according to another exemplary aspect of the invention, a controller 425 (e.g., a multi-axes motion controller) is operably coupled to drivers and/or amplifiers (not shown) of the first and second actuators 405 and 410 and the first and second sensing elements 415 and 420, wherein the controller 425 is operable to control an amount of power 430 and 435 (e.g., a drive signal) provided to the respective first and second actuators for an associated control duty cycle (e.g., a movement of the end effector 130 between maximum positions 160 and 162 illustrated in FIG. 2). The first and second sensing elements 415 and 420 of FIG. 6, such as encoders or resolvers, are further operable to provide respective feedback signals 440 and 445 to the controller 425, wherein the drive signals 430 and 435 to the respective actuators 405 and 410, for example, are calculated in real-time. Such real-time calculations of the drive signals 430 and 435 generally permits a precise adjustment of the power delivered to each respective actuator 405 and 410 at predetermined time increments.

In accordance with another exemplary aspect of the invention, the general scheme of motion control disclosed in the invention generally provides a smoothness of motion of the end effector 130, and can minimize velocity errors associated therewith. According to another example, the controller 425 further comprises an inverse kinematic model (not shown), wherein the articulated motion of the end effector 130 is derived for each joint 125 and 140 at each duty cycle. The controller 425, for example, comprises a proportional integral derivative (PID) control device which can be utilized by the controller, wherein the first and second sensing elements 415 and 420 generally provide dual loop feedback control. Such feedback control, for example, can be utilized to compensate for mechanical backlash associated with the oscillatory subsystem 110.

As discussed in the above example, the amount of power 430 and 435 provided to the respective first and second actuators 405 and 410 is based, at least in part, on the positions sensed by one or more of the respective first and second sensing elements 415 and 420. Accordingly, the position of the end effector 130 of the scanning apparatus 200 can be controlled by controlling the amount of power provided to the first and second actuators 405 and 410, wherein the amount of power is further associated with a velocity and acceleration of the end effector along the first scan path 145 of FIG. 4. The controller 425 of FIG. 8, for example, is further operable to control the secondary translation mechanism 350 of FIG. 6, therein further controlling the motion of the end effector 130 along the second scan path 355. According to one example, an incremental motion (e.g., a "slow scan" motion) of the secondary translation mechanism 350 is synchronized with the motion of the end effector 130 along the first scan path 145 (e.g., a "fast scan" motion), such that the secondary translation mechanism is incrementally moved after each pass of the substrate 155 through the ion beam (e.g, during a change of direction of the wafer along the fast scan path).

Figure 9:
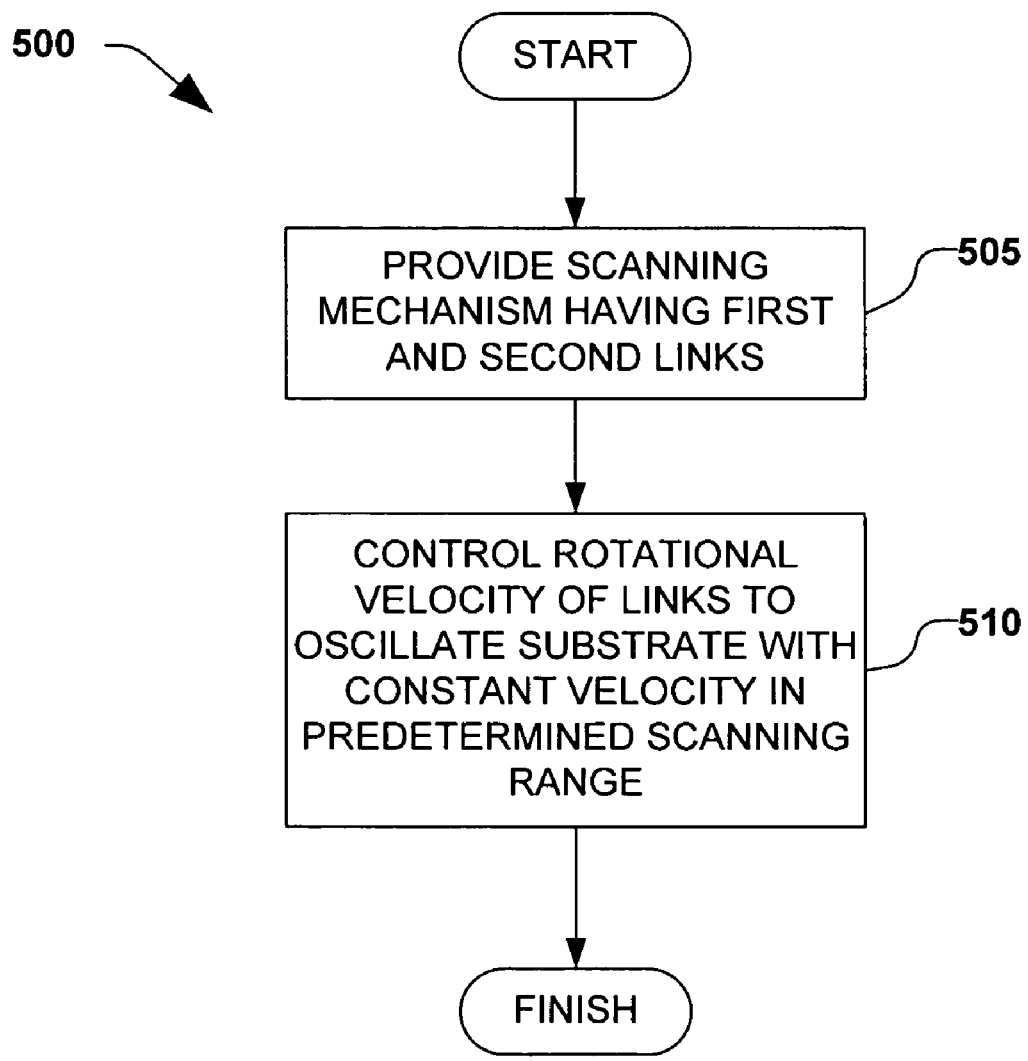
FIG. 9 is a block diagram of a method for processing a substrate according to another exemplary aspect of the invention.

According to still another exemplary aspect of the present invention, FIG. 9 is a schematic block diagram of an exemplary method 500 illustrating the integration and operation of the exemplary scanning apparatus of FIG. 1. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 9, the method 500 begins with providing a scanning apparatus comprising an oscillatory subsystem in act 505, wherein a first link and second link are rigidly coupled to one another at a first joint. A second joint couples the second link to a first actuator, wherein the first actuator is operable to translate the second joint, thus rotating the first and second links about the first joint. A rotational velocity of the links is controlled in act 510, wherein the end effector oscillates between two maximum positions, and wherein the velocity of the end effector is maintained generally constant within a predetermined range. Within the predetermined range, for example, an ion beam impinges upon the substrate, wherein the substrate is substantially uniformly exposed to the ion beam throughout the motion of the substrate. A predetermined control scheme may be utilized, such that non-linear inertial, coriolis and/or centripetal forces induced by links on joint actuators are compensated.

The scanning apparatus of the present invention further provides sufficient dexterity such that the scanning apparatus can further participate in material handling tasks. Such material handling tasks, for example, may comprise placing or transferring processed wafers to another transfer mechanism. Conversely, loading or picking of un-processed wafers can further be accomplished by mating with another transfer device.

In accordance with another exemplary aspect of the present invention, the scanning apparatus can be further utilized in a process chamber (not shown) that is in a state of high vacuum, wherein no mechanical components such as lubricated bearings or actuators are directly exposed to the environment. In order to achieve such ends, the joints of the apparatus, for example, are further provided with vacuum seals, such as Ferro-fluidic seals. It should be understood that any type of movable vacuum seal that provides an integrity of cleanliness of the process is contemplated as falling within the scope of the present invention. Therefore, the present invention is further operable to provide a motion generation and wafer scanning in a clean, vacuum environment.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A scanning apparatus for processing a substrate, the scanning apparatus comprising:
   a base portion; and
   an oscillatory subsystem, comprising:
   a first link and a second link rigidly coupled to one another at a first joint, wherein the first link and second link are further rotatably coupled to the base portion by the first joint, therein defining a first axis of rotation,
   an end effector coupled to the first link and spaced a first distance from the first joint, wherein the substrate generally resides on the end effector; and
   a first actuator rigidly coupled to the base portion, wherein the second link is further coupled to the first actuator via at least a second joint, wherein the second joint is spaced a second distance from the first joint, and wherein the first actuator is operable to translate the second joint with respect to the base portion, therein rotating the first and second links about the first axis and translating the substrate along a first scan path.

2. The scanning apparatus of claim 1, wherein the first actuator comprises a curvilinear actuator.

3. The scanning apparatus of claim 2, wherein the curvilinear actuator comprises one or more rotary motor segments.

4. The scanning apparatus of claim 3, wherein the one or more rotary motor segments have a rotor arc of between approximately 45° and 90° and a stator arc of between approximately 80° and 120°.

5. The scanning apparatus of claim 1, further comprising a second actuator, wherein the second actuator is coupled to the first joint, and wherein the second actuator is further operable to rotate the first joint with respect to the base portion.

6. The scanning apparatus of claim 5, wherein the second actuator comprises a servo motor fixedly mounted to the base portion.

7. The scanning apparatus of claim 5, wherein the second actuator is operable to vary a rotational velocity of the first joint in accordance with a location of the end effector.

8. The scanning apparatus of claim 1, wherein the first actuator is operable to vary a rotational velocity of the first joint in accordance with a location of the end effector.

9. The scanning apparatus of claim 1, wherein the first link and the second link are generally co-linear.

10. The scanning apparatus of claim 1, wherein the first distance is larger than the second distance.

11. The scanning apparatus of claim 1, further comprising one or more encoders, wherein the one or more encoders are operable to determine a position of one or more of the first joint and the second joint.

12. The scanning apparatus of claim 1, further comprising a controller operable to control a translational velocity of the second joint by controlling an amount of power provided to the first actuator such that a velocity of the end effector is generally constant within a predetermined scanning range.

13. The scanning apparatus of claim 12, further comprising one or more sensing elements, wherein the one or more sensing elements are operable to sense a position of one or more of the first joint and second joint, and wherein the one or more sensing elements are further operable to feed back the respective sensed positions to the controller.

14. The scanning apparatus of claim 13, wherein the one or more sensing elements comprise one or more encoders.

15. The scanning apparatus of claim 14, wherein the one or more sensing elements comprise one or more of a rotary encoder associated first joint and a linear encoder associated with the second joint.

16. The scanning apparatus of claim 1, wherein the first scan path is curvilinear.

17. The scanning apparatus of claim 1, wherein the end effector is operably coupled to the first link by a third joint, wherein the end effector is further operable to move in one or more directions with respect to the first link.

18. The scanning apparatus of claim 17, wherein the third joint comprises a prismatic joint and is operable to provide the end effector with two or more degrees of freedom.

19. The scanning apparatus of claim 18, wherein the third joint is operable to provide one or more of a rotation and a tilt of the end effector with respect to the first link.

20. The scanning apparatus of claim 1, wherein the end effector comprises an electrostatic chuck.

21. The scanning apparatus of claim 1, further comprising:
   a second actuator rigidly coupled to the base portion, wherein the second actuator is operable to rotate the first joint with respect to the base portion; and
   a third link rotatably coupled to the second link via the second joint, wherein the third link is further coupled to the first actuator via a fourth joint, and wherein the first actuator is further operable to translate the fourth joint with respect to the base portion, therein driving the translation of the second joint.

22. The scanning apparatus of claim 21, wherein first actuator comprises a linear actuator and the second actuator comprises a rotary actuator, and wherein the second actuator is further operable to rotate the first joint in a clockwise and counter-clockwise direction.

23. The scanning apparatus of claim 21, further comprising a controller operable to control a translational velocity of the end effector by controlling an amount of power provided to the respective first actuator and second actuator.

24. The scanning apparatus of claim 23, further comprising one or more sensing elements, wherein the one or more sensing elements are operable to sense a position of one or more of the first joint, second joint, and fourth joint and wherein the one or more sensing elements are further operable to feed back the respective sensed positions to the controller.

25. The scanning apparatus of claim 24, further comprising:
   a third actuator rigidly coupled to the base portion; and
   a fourth link rotatably coupled to the second link via the second joint, wherein the fourth link is further coupled to the third actuator via a fifth joint, and wherein the third actuator is operable to translate the fifth joint with respect to the base portion, therein further driving the translation of the second joint.

26. The scanning apparatus of claim 25, wherein the first and third actuators each comprise a linear actuator and the second actuator comprises a rotary actuator, wherein the second actuator is operable to rotate the second joint in a clockwise and counter-clockwise direction.

27. The scanning apparatus of claim 25, further comprising a controller operable to control a translational velocity of the end effector by controlling an amount of power provided to the respective first actuator, second actuator, and third actuator.

28. The scanning apparatus of claim 27, further comprising one or more sensing elements, wherein the one or more sensing elements are operable to sense a position of one or more of the first joint, second joint, fourth joint, and fifth joint, and wherein the one or more sensing elements are further operable to feed back the respective sensed positions to the controller.

29. The scanning apparatus of claim 28, wherein the one or more sensing elements comprise one or more encoders.

30. The scanning apparatus of claim 29, wherein the one or more sensing elements comprise one or more of a rotary encoder associated first joint and one or more linear encoders associated with one or more of the fourth joint and fifth joint.

31. The scanning apparatus of claim 1, further comprising a secondary translation mechanism operably coupled to the base portion, wherein the secondary translation mechanism is operable to move the base portion in one or more directions.

32. The scanning apparatus of claim 31, wherein the secondary translation mechanism is operable to move the base portion along a second scan path, wherein the second scan path is generally perpendicular to at least a portion of the first scan path.

33. The scanning apparatus of claim 32, wherein the secondary translation mechanism comprises a linear drive system, wherein the linear drive system is operable to linearly translate the base portion along the second scan path.

34. The scanning apparatus of claim 32, wherein the secondary translation mechanism comprises one or more articulated arms, wherein the one or more articulated arms are operable to translate the base portion along the second scan path.

35. The scanning apparatus of claim 1, further comprising a rotary seal associated with the first joint, wherein the first link generally resides within a process chamber and the second link generally resides outside the process chamber, and wherein the rotary seal generally isolates an environment outside the process chamber from an environment within the process chamber.

36. The scanning apparatus of claim 1, further comprising a secondary actuation system, wherein the secondary actuation system is operable to counteract reaction forces induced by the oscillatory subsystem.

37. The scanning apparatus of claim 36, wherein the secondary actuation system comprises one or more masses rotatably coupled to the oscillatory subsystem.

38. The scanning apparatus of claim 37, wherein the secondary actuation system further comprises a counterbalance actuator operably coupled to the one or more masses.

39. The scanning apparatus of claim 36, wherein the secondary actuation system generally resides in an environment which is different than an environment in which the end effector generally resides.

\* \* \* \* \*